United States Patent
Bruce et al.

[11] Patent Number: 6,145,470
[45] Date of Patent: Nov. 14, 2000

[54] APPARATUS FOR ELECTRON BEAM PHYSICAL VAPOR DEPOSITION

[75] Inventors: Robert W. Bruce, Loveland; John D. Evans, Sr., Springfield, both of Ohio

[73] Assignee: General Electric Company, Cincinnati, Ohio

[21] Appl. No.: 09/209,296

[22] Filed: Dec. 11, 1998

[51] Int. Cl.$^7$ ...................................................... C23F 1/02
[52] U.S. Cl. .............................. 118/723 EB; 118/723 FE; 219/121.12; 250/492.3
[58] Field of Search ....................... 118/723 EB, 723 VE, 118/723 FE, 726, 727; 204/298.36; 156/345; 219/121.12; 250/492.3; 117/905

[56] References Cited

U.S. PATENT DOCUMENTS

| | | | |
|---|---|---|---|
| 3,590,777 | 7/1971 | Elam et al. | 118/7 |
| 3,607,222 | 9/1971 | Kennedey | 75/10 V |
| 3,667,421 | 6/1972 | Bala et al. | 118/7 |
| 3,730,962 | 5/1973 | Norwalk | 13/31 |
| 4,153,005 | 5/1979 | Norton et al. | 118/49.1 |
| 4,237,148 | 12/1980 | Aichert et al. | 427/42 |
| 5,418,003 | 5/1995 | Bruce et al. | 427/126.2 |
| 5,792,521 | 8/1998 | Wortman | 427/567 |

FOREIGN PATENT DOCUMENTS

| | | |
|---|---|---|
| 0 785 291 A1 | 1/1997 | European Pat. Off. . |
| 0 816 528 A1 | 6/1997 | European Pat. Off. . |
| 1094747 | 2/1965 | United Kingdom . |

*Primary Examiner*—Thi Dang
*Assistant Examiner*—Luz Alejandro
*Attorney, Agent, or Firm*—Andrew C. Hess; David L. Narciso

[57] ABSTRACT

An apparatus for depositing a ceramic coating by electron beam physical vapor deposition (EBPVD). Ceramic coatings of more uniform thickness over a larger surface area are deposited by increasing the size of a pool of molten ceramic from which the ceramic is deposited. The apparatus uses a crucible that surrounds a ceramic material that serves as the source of the deposited ceramic coating. The crucible is configured to define a reservoir whose cross-sectional area is larger than the cross-sectional area of the ceramic material. The size of the pool is increased by increasing the size of the reservoir in lieu of increasing the diameter of the ceramic material in order to maintain acceptable ingot quality.

10 Claims, 2 Drawing Sheets

APPARATUS FOR ELECTRON BEAM PHYSICAL VAPOR DEPOSITION

FIELD OF THE INVENTION

This invention relates to coating apparatuses of the type used to deposit ceramic coatings. More particularly, this invention is directed to an electron beam physical vapor deposition (EBPVD) apparatus with a crucible configured to increase the zone within the apparatus coating chamber in which the deposited coating thickness is maintained within an acceptable variation requirement.

BACKGROUND OF THE INVENTION

Higher operating temperatures of gas turbine engines are continuously sought in order to increase their efficiency. However, as operating temperatures increase, the high temperature durability of the components of the engine must correspondingly increase. Significant advances in high temperature capabilities have been achieved through the formulation of nickel and cobalt-base superalloys, though such alloys alone are often inadequate to form components located in the hot sections of a gas turbine engine, such as the turbine, combustor and augmentor. A common solution is to thermally insulate such components in order to minimize their service temperatures. For this purpose, thermal barrier coatings (TBCs) formed on the exposed surfaces of high temperature components have found wide use.

To be effective, TBCs must have low thermal conductivity, be capable of strongly adhering to the article, and remain adherent through many heating and cooling cycles. The latter requirement is particularly demanding due to the different coefficients of thermal expansion between low thermal conductivity materials used to form TBCs, typically ceramic, and materials used to form turbine engine components, typically superalloys. For this reason, ceramic TBCs are typically deposited on a metallic bond coat that is formulated to promote the adhesion of the ceramic layer to the component while also inhibiting oxidation of the underlying superalloy. Together, the ceramic layer and metallic bond coat form what is termed a thermal barrier coating system. Typical bond coat materials are diffusion aluminides and oxidation-resistant alloys such as MCrAlY, where M is iron, cobalt and/or nickel.

Various ceramic materials have been employed as the TBC, particularly zirconia ($ZrO_2$) stabilized by yttria ($Y_2O_3$), magnesia (MgO) or other oxides. These particular materials are widely employed in the art because they can be readily deposited by plasma spray, flame spray or vapor deposition techniques. A continuing challenge of thermal barrier coating systems has been the formation of a more adherent ceramic layer that is less susceptible to spalling when subjected to thermal cycling. In one form, improved spallation resistance is achieved with ceramic coatings deposited by electron beam physical vapor deposition (EBPVD) to yield a columnar grain structure. Such grain structures are characterized by gaps between grains that are oriented perpendicular to the substrate surface, and therefore promote strain tolerance by enabling the ceramic layer to expand with its underlying substrate without causing damaging stresses that lead to spallation.

FIG. 1 represents a coating apparatus 20 for depositing ceramic coatings by EBPVD in accordance with the prior art. The apparatus 20 includes a coating chamber 22 in which a component 30 is suspended for coating. A ceramic layer 32 is deposited on the component 30 by melting a ceramic ingot 10 with an electron beam 26 produced by an electron beam (EB) gun 28. The intensity of the beam 26 is sufficient to produce a stream of ceramic vapor 34 that condenses on the component 30 to form the ceramic layer 32. As shown, the ceramic vapor 34 evaporates from a pool 14 of molten ceramic contained within a reservoir 18 formed by a crucible 12 that surrounds the upper end of the ingot 10. Crucibles of the type shown are often made of copper, though it is foreseeable that other materials could be used. Cooling passages 16 maintain the crucible 12 at an acceptable temperature. Because the crucible 12 must closely fit around the ingot 10 to prevent leakage, the size of the pool 14 is determined by the size of the ceramic ingot 10, which has a typical diameter of about 6.3 centimeters. As it is gradually consumed by the deposition process, the ingot 10 is incrementally fed into the chamber 22 through an airlock 24. During deposition, the chamber 22 is typically maintained at a pressure of about 0.005 mbar.

Zirconia-based thermal barrier coatings, and particularly yttria-stabilized zirconia (YSZ) coatings, produced by EBPVD to have columnar grain structures are widely employed in the art for their desirable thermal and adhesion characteristics. Nonetheless, there is an ongoing effort to improve deposition processes for thermal barrier coatings, particularly in terms of improved deposition efficiency and spallation resistance.

SUMMARY OF THE INVENTION

The present invention is a coating apparatus for depositing a ceramic coating on an article that will be subjected to a hostile environment, as is the case with turbine, combustor and augmentor components of a gas turbine engine. Such ceramic coatings preferably are part of a thermal barrier coating system that includes a metallic bond coat that improves the adhesion of the ceramic coating to a superalloy substrate. Ceramic coatings of particular interest are formed of yttria-stabilized zirconia (YSZ) and have a columnar grain structure as a result of being deposited by EBPVD.

According to the invention, ceramic coatings of more uniform thickness over larger surfaces can be deposited if the size of the pool of molten ceramic is increased. More particularly, it has been determined that larger molten pools provide a larger coating zone within the coating apparatus which, as used herein, identifies a zone within the coating apparatus in which coating thickness is reliably and consistently maintained within a certain variation requirement, e.g., on the order of about ±10%. The apparatus achieves this object of the invention with the use of a crucible that surrounds the ceramic ingot serving as the source of the deposited ceramic coating. Of importance is that the crucible is configured to define a reservoir whose cross-sectional area is larger than the cross-sectional area of the ceramic material. According to the invention, the size of the pool is increased by increasing the size of the reservoir in lieu of increasing the diameter of the ceramic material in order to maintain acceptable ingot quality. Accordingly, the apparatus of this invention improves the efficiency and uniformity of the coating process by providing a larger zone within the chamber over which acceptable coatings can be produced, enabling more components or larger components to be simultaneously coated without sacrificing coating quality. Notably, process complications that would normally discourage those skilled in the art from attempting to alter the pool reservoir size relative to the ingot, such as solidification of the molten ceramic and a modified crucible-ceramic attachment, etc., are addressed in order to achieve this invention.

Other objects and advantages of this invention will be better appreciated from the following detailed description.

DETAILED DESCRIPTION OF THE INVENTION

The present invention is generally directed to ceramic coatings that are deposited as part of a thermal barrier coating system on a metal component intended for operation within a high-temperature environment. Notable examples of such components include the high and low pressure turbine nozzles and blades, shrouds, combustor liners and augmentor hardware of gas turbine engines. While the advantages of this invention will be described with reference to components of gas turbine engines, the teachings of this invention are generally applicable to any component on which a ceramic coating might be deposited.

Figure 1:
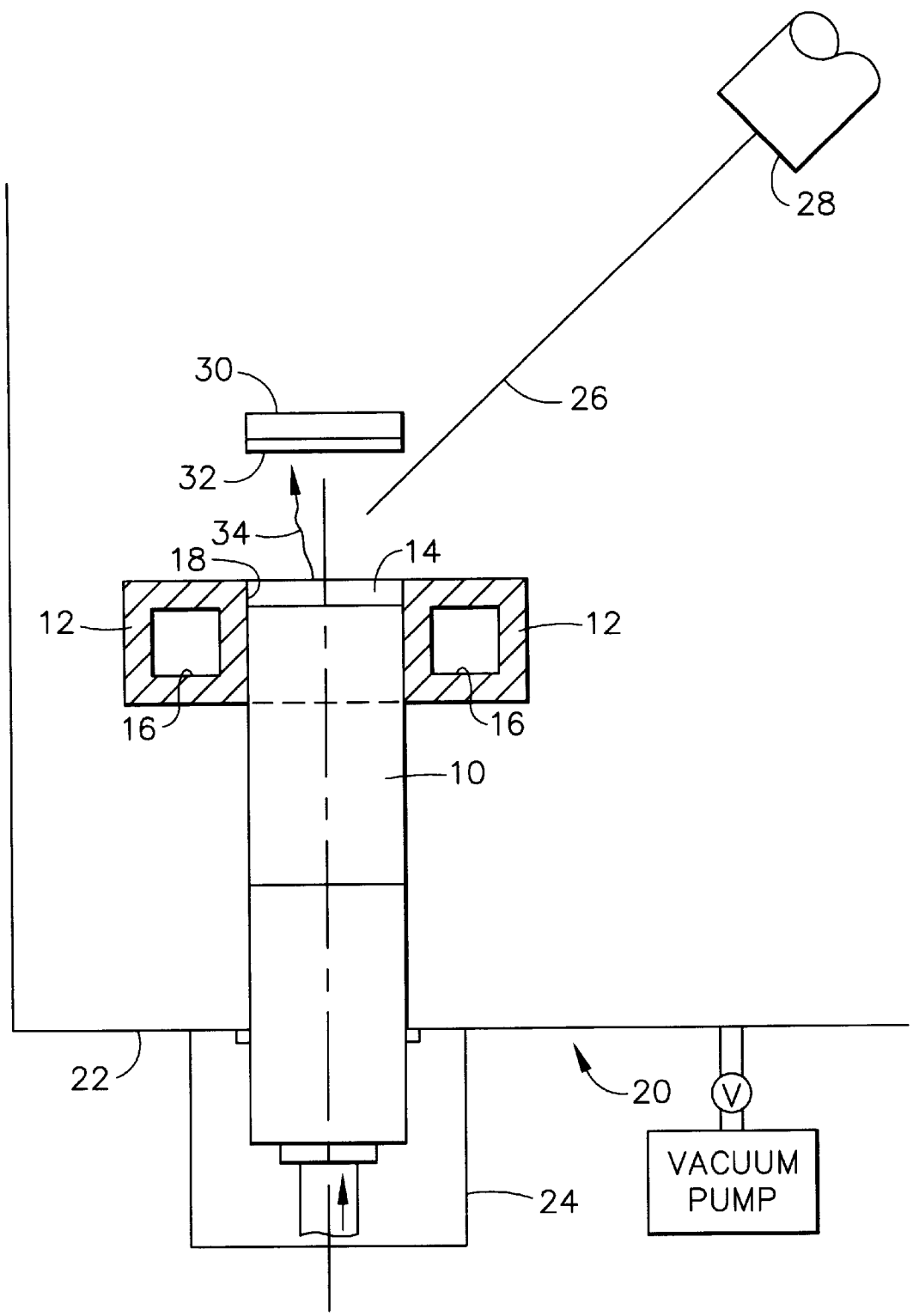
FIG. 1 shows a schematic representation of an electron beam physical vapor deposition apparatus used to deposit a ceramic layer of a thermal barrier coating system in accordance with the prior art.
Figure 2:
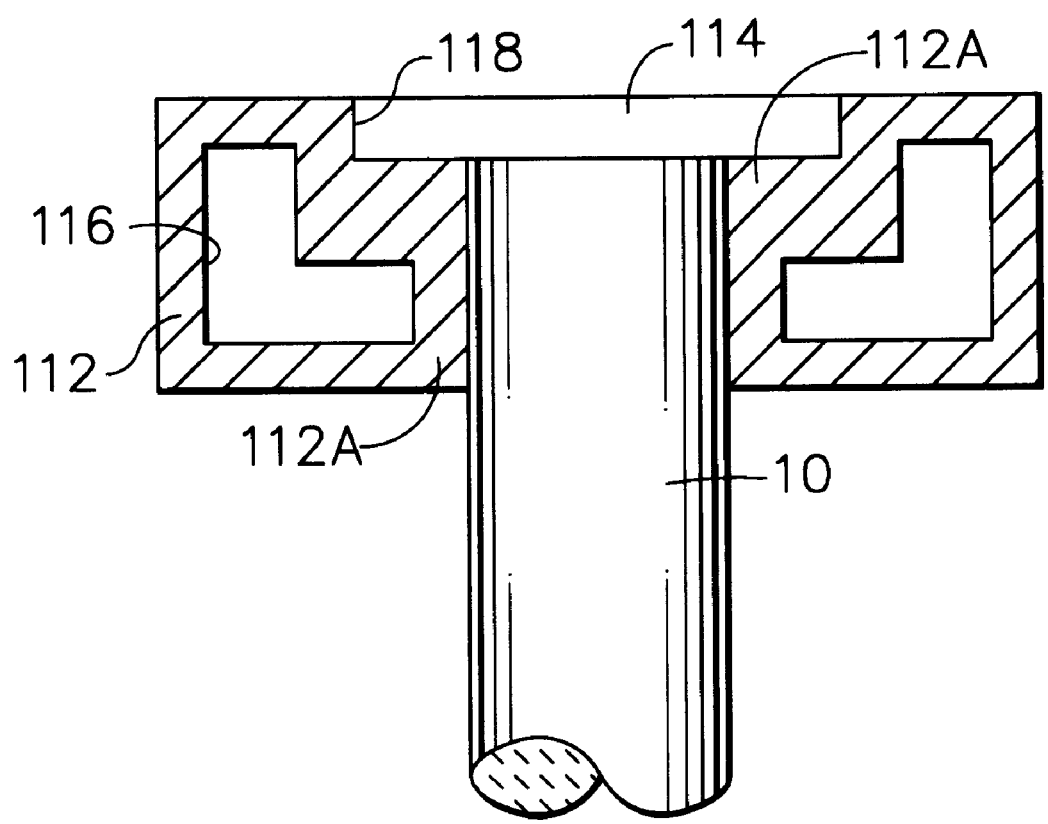
FIG. 2 is a cross-sectional view of a crucible adapted for use with the apparatus of FIG. 1 in accordance with this invention.

FIG. 2 shows a crucible 112 of a type that can be used with the EBPVD coating apparatus 20 shown in FIG. 1. As is conventional, the crucible 112 can be formed of copper or another suitable material, and includes a cooling passage 116 through which water or another suitable cooling medium flows. The crucible 112 is shown as having a collar portion 112A that closely surrounds the ingot 10. Contrary to the prior art, the crucible 112 of this invention has a larger reservoir 118 than that of the crucible 12 shown in FIG. 1. The cross-sectional area of the reservoir 118 is preferably about 10% to about 50% larger than the cross-sectional area of the ingot 10—with larger areas, it was determined to be extremely difficult to maintain a uniform flow of molten ceramic into the reservoir 118 as the ingot 10 is melted by the electron beam 26, and difficult to keep the reservoir 118 suitably filled. A preferred cross-sectional area for the reservoir 118 is about 38 to about 70 cm$^2$ for standard ingot diameters of about 6.3 cm (about 31 cm$^2$). Within the preferred range of cross-sectional areas, a preferred depth for the reservoir 118 is about 0.2 to about 1.0 centimeters. Though not required, the reservoir 118 and ingot 10 preferably have circular and concentric cross-sections.

An EBPVD coating apparatus (e.g., the apparatus 20 of FIG. 1) modified with the crucible 112 of this invention is typically operated at a vacuum level of about 5×10$^{-3}$ Torr (about 0.005 mbar) during deposition of the ceramic layer 32. If for a gas turbine engine application, the component 30 is typically formed of a nickel or cobalt-base superalloy, though other materials may be used. The ceramic coating 32 is typically part of a coating system that includes a metallic bond coat (not shown) over which the ceramic coating 32 is deposited. In accordance with the prior art, the bond coat is preferably an oxidation-resistant metal composition that protects the underlying superalloy substrate from oxidation and promotes adhesion of the ceramic coating 32. As known in the art, suitable bond coat materials include diffusion aluminides containing intermetallic platinum and/or nickel aluminide phases, and MCrAlY alloys such as NiCrAlY.

Following deposition of the bond coat, the ceramic coating 32 is deposited from a vapor formed by melting and vaporizing the ingot 10 with the electron beam 26 generated and emitted by the electron beam gun 28. The component 30 can be secured to a rotatable support (not shown) of a type known in the art, so as to be adjacent the upper end of the ingot 10. The electron beam 26 is directed toward the upper end of the ingot 10, which causes the surface of the ingot 10 to melt and form a molten pool 114 within the larger reservoir 118 of the crucible 112. Intense heating of the ingot 10 by the electron beam 26 causes molecules of the ceramic material to evaporate, travel upwardly, and then deposit (condense) on the surface of the component 30, all in a manner known in the art.

While our invention has been described in terms of a preferred embodiment, it is apparent that modifications could be adopted by one skilled in the art. For example, ceramic material in the form of a powder, pellets or a granular material, could be used in place of the ingot 10 shown in FIGS. 1 and 2. Accordingly, the scope of our invention is to be limited only by the following claims.

What is claimed is:

1. A deposition apparatus comprising:

a coating chamber;

means for generating an electron beam within the coating chamber;

a ceramic material within the coating chamber, the ceramic material having an upper end with a cross-sectional area; and a crucible surrounding the upper end of the ceramic material, the crucible defining a reservoir having a larger cross-sectional area than the cross-sectional area of the ceramic material.

2. A deposition apparatus as recited in claim 1, wherein the cross-sectional area of the reservoir is about 10% to about 50% larger than the cross-sectional area of the ceramic material.

3. A deposition apparatus as recited in claim 1, wherein the ceramic material is in the form of an ingot.

4. A deposition apparatus as recited in claim 1, wherein the ceramic material is in the form of a powder, pellets or granular material.

5. A deposition apparatus as recited in claim 1, wherein the crucible has a cooling channel therethrough through which a cooling medium flows.

6. A deposition apparatus as recited in claim 1, wherein the reservoir of the crucible has an approximately circular cross-sectional area.

7. A deposition apparatus as recited in claim 6, wherein the upper end of the ceramic material has an approximately circular cross-sectional area.

8. A deposition apparatus as recited in claim 7, wherein the circular cross-sectional area of the reservoir is concentric with the circular cross-sectional area of the ceramic material.

9. A deposition apparatus as recited in claim 1, wherein the reservoir has a depth of about 0.2 cm to about 1.0 cm.

10. A deposition apparatus comprising:

a coating chamber;

an electron beam gun generating an electron beam within the coating chamber;

a ceramic ingot within the coating chamber, the ceramic ingot having an upper end with an approximately circular cross-sectional area and a diameter of up to about 6.3 centimeters; and a crucible surrounding the upper end of the ceramic ingot, the crucible having a cooling channel therethrough through which a cooling medium flows, the crucible defining a reservoir having a depth of about 0.2 to about 1.0 centimeters and having an approximately circular cross-sectional area of about 38 square centimeters to about 70 square centimeters, the circular cross-sectional area of the reservoir being concentric with the circular cross-sectional area of the ceramic ingot.

* * * * *